US010352963B2

(12) United States Patent
Omidi et al.

(10) Patent No.: US 10,352,963 B2
(45) Date of Patent: Jul. 16, 2019

(54) DYNAMIC SWEEP-PLOW MICROCANTILEVER DEVICE AND METHODS OF USE

(71) Applicant: The Board of Trustees of the University of Alabama, Tuscaloosa, AL (US)

(72) Inventors: Ehsan Omidi, Tuscaloosa, AL (US); Nima Mahmoodi, Tuscaloosa, AL (US)

(73) Assignee: The Board of Trustees of The University of Alabama, Tuscaloosa, AL (US)

(*) Notice: Subject to any disclaimer, the term of this patent is extended or adjusted under 35 U.S.C. 154(b) by 369 days.

(21) Appl. No.: 15/389,052

(22) Filed: Dec. 22, 2016

(65) Prior Publication Data

US 2017/0176491 A1     Jun. 22, 2017

Related U.S. Application Data

(60) Provisional application No. 62/271,092, filed on Dec. 22, 2015.

(51) Int. Cl.
*G01Q 10/04*      (2010.01)
*G01Q 70/10*      (2010.01)
(Continued)

(52) U.S. Cl.
CPC .......... *G01Q 10/045* (2013.01); *G01Q 70/10* (2013.01); *G03F 7/0002* (2013.01); *G01Q 80/00* (2013.01)

(58) Field of Classification Search
None
See application file for complete search history.

(56) References Cited

U.S. PATENT DOCUMENTS 7,441,444 B2 * 10/2008 Hoh .................. G01Q 60/38
                                                 216/2
7,579,052 B2 * 8/2009 Boiadjiev ........... G01N 29/022
                                                427/299
(Continued)

OTHER PUBLICATIONS

Akita, S., and Nakayama, Y., 2004, "Nanoscale Variable Resistance using Interlayer Sliding of Multiwall Nanotube," Japanese Journal of Applied Physics, Part 1: Regular Papers and Short Notes and Review Papers, 43(6 B) pp. 3796-3798.

(Continued)

*Primary Examiner* — Andrew Smyth
(74) *Attorney, Agent, or Firm* — Meunier Carlin & Curfman LLC

(57) ABSTRACT

Implementations include a dynamic sweep-plow microcantilever (DSPM) device for nano-machining, nano-manufacturing, and nano-imaging using SPMs (e.g., an AFM). The DSPM device includes two elongated cantilevered arms that are spaced apart at their proximal ends and on which a piezoelectric layer is disposed. The distal ends of the arms are coupled together, and a distal tip is coupled to the distal ends and extends below a plane that includes a lower surface of the arms. The DSPM device is mounted on the AFM and applies nano-machining force through vibration that is induced by the piezoelectric layers on the arms. The DSPM device can vibrate such that the tip undergoes one or both of bending and torsional vibrations, which allows the DSPM device to perform both plowing and/or sweeping in nanoscale. The piezoelectric layers can be used for sensing by collecting vibrational feedback at the distal tip using a laser sensor.

14 Claims, 6 Drawing Sheets

(51) Int. Cl.
G01Q 80/00 (2010.01)
G03F 7/00 (2006.01)

(56) References Cited

U.S. PATENT DOCUMENTS

| | | | |
|---|---|---|---|
| 2003/0154771 A1* | 8/2003 | de Charmoy Grey | G01N 9/002 73/53.01 |
| 2005/0034512 A1* | 2/2005 | Su | B82Y 35/00 73/104 |
| 2007/0141721 A1* | 6/2007 | Vafai | G01N 33/54373 436/518 |
| 2015/0203345 A1* | 7/2015 | Sachin | B81B 3/0021 257/415 |

OTHER PUBLICATIONS

Alizadegan, R., Liao, A. D., Xiong, F., 2012, "Effects of Tip-Nanotube Interactions on Atomic Force Microscopy Imaging of Carbon Nanotubes," Nano Research, 5(4) pp. 235-247.
Amini, S., Soleimanimehr, H., Nategh, M., 2008, "FEM Analysis of Ultrasonic-Vibration-Assisted Turning and the Vibratory Tool," Journal of Materials Processing Technology, 201(1) pp. 43-47.
Anselmetti, D., Fritz, J., Smith, B., 2000, "Single Molecule DNA Biophysics with Atomic Force Microscopy," Single Molecules, 1(1), 6 pages.
Babahosseini, H., Carmichael, B., Strobl, J., 2015, "Sub-Cellular Force Microscopy in Single Normal and Cancer Cells," Biochemical and Biophysical Research Communications, 6 pages.
Bhushan, B., 2001, "Nano-to Microscale Wear and Mechanical Characterization using Scanning Probe Microscopy," Wear, 251(1) pp. 1105-1123.
Bhushan, B., and Sundararajan, S., 1998, "Micro/Nanoscale Friction and Wear Mechanisms of Thin Films using Atomic Force and Friction Force Microscopy," Acta Materialia, 46(11) pp. 3793-3804.
Bobba, S., Zhang, J., Gaillardon, P., 2014, "System Level Benchmarking with Yield-Enhanced Standard Cell Library for Carbon Nanotube VLSI Circuits," ACM Journal on Emerging Technologies in Computing Systems, 10(4) 19 pp.
Brehl, D., and Dow, T., 2008, "Review of Vibration-Assisted Machining," Precision Engineering, 32(3) pp. 153-172.
Cappella, B., and Sturm, H., 2002, "Comparison between Dynamic Plowing Lithography and Nanoindentation Methods," Journal of Applied Physics, 91(1) pp. 506-512.
Cappella, B., Sturm, H., and Weidner, S., 2002, "Breaking Polymer Chains by Dynamic Plowing Lithography," Polymer, 43(16) pp. 4461-4466.
Carmichael, B., Babahosseini, H., Mahmoodi, S., 2015, "The Fractional Viscoelastic Response of Human Breast Tissue Cells," Physical Biology, 12(4) pp. 046001.
Collins, P. G., and Avouris, P., 2000, "Nanotubes for Electronics," Scientific American (International Edition), 283(6) pp. 62-69.
Costa, K., and Yin, F., 1999, "Analysis of Indentation: Implications for Measuring Mechanical Properties with Atomic Force Microscopy," Journal of Biomechanical Engineering, 121(5) pp. 462-471.
Cui Yan, Zhao Lin, Dong Weijie, 2012, "Fabrication and Characterisation of Piezoelectric Microcantilever Probe," Micro & Nano Letters, IET, 7(4) pp. 306-308.
Deshpande, M., and Saggere, L., 2007, "PZT Thin Films for Low Voltage Actuation: Fabrication and Characterization of the Transverse Piezoelectric Coefficient," Sensors and Actuators A: Physical, 135(2) pp. 690-699.
DeVoe, D. L., and Pisano, A. P., 1997, "Modeling and Optimal Design of Piezoelectric Cantilever Microactuators," Journal of Microelectromechanical Systems, 6(3) pp. 266-270.
Dong, W., Lu, X., Cui, Y., 2007, "Fabrication and Characterization of Microcantilever Integrated with PZT Thin Film Sensor and Actuator," Thin Solid Films, 515(24) pp. 8544-8548.
Duan, X., Tang, C., Zhang, J., 2007, "Two Distinct Buckling Modes in Carbon Nanotube Bending," Nano Letters, 7(1), 5 pp.
Dufrene, Y. F., Boonaert, C. J. P., van, d. M., 2001, "Probing molecular interactions and mechanical properties of microbial cell surfaces by atomic force microscopy," Second International Conference on Scanning Probe Microscopy, Sensors and Nanostructures, Elsevier, Netherlands, 86, pp. 113-120.
Faegh, S., Jalili, N., and Sridhar, S., 2013, "A Self-Sensing Piezoelectric MicroCantilever Biosensor for Detection of Ultrasmall Adsorbed Masses: Theory and Experiments," Sensors, 13pp. 6089-6108.
Fang, T., Weng, C., and Chang, J., 2000, "Machining Characterization of the Nano-Lithography Process using Atomic Force Microscopy," Nanotechnology, 11(3) pp. 181-187.
Fang, T., Wu, C., and Kang, S., 2011, "Thermomechanical Properties of Polymer Nanolithography using Atomic Force Microscopy," Micron, 42(5) pp. 492-497.
Fleming, A. J., 2010, "Quantitative Scanning Probe Microscope Topographies by Charge Linearization of the Vertical Actuator," Review of Scientific Instruments, 81(10), 103701.
Florea, C., Berdich, K., and Dreucean, M., 2012, "Topography Imaging of Material Surfaces using Atomic Force Microscope," Solid State Phenomena, 188pp. 199-204.
Frank, I., Tanenbaum, D. M., Van der Zande, A., 2007, "Mechanical Properties of Suspended Graphene Sheets," Journal of Vacuum Science & Technology B, 25(6) pp. 2558-2561.
Geng, Y., Yan, Y., Xing, Y., 2013, "Effect of Cantilever Deformation and Tip-Sample Contact Area on AFM Nanoscratching," Journal of Vacuum Science & Technology B, 31(6) 8 pp. 061802.
Hansma, H. G., 2001, "Surface Biology of DNA by Atomic Force Microscopy," Annual Review of Physical Chemistry, 52pp. 71-92.
Held, R., Lüscher, S., Heinzel, T., 1999, "Fabricating Tunable Semiconductor Devices with an Atomic Force Microscope," Applied Physics Letters, 75(8) pp. 1134-1136.
Heyde, M., Rademann, K., Cappella, B., 2001, "Dynamic Plowing Nanolithography on Polymethylmethacrylate using an Atomic Force Microscope," Review of Scientific Instruments, 72(1) pp. 136-141.
Itoh, T., and Suga, T., 1993, "Development of a Force Sensor for Atomic Force Microscopy using Piezoelectric Thin Films," Nanotechnology, 4(4) pp. 218-224.
Itoh, T., Lee, C., and Suga, T., 1996, "Deflection Detection and Feedback Actuation using a Self-excited Piezoelectric Pb (Zr, Ti) O3 Microcantilever for Dynamic Scanning Force Microscopy," Applied Physics Letters, 69(14) pp. 2036-2038.
Ivan, I. A., Rakotondrabe, M., Lutz, P., 2009, "Current Integration Force and Displacement Self-Sensing Method for Cantilevered Piezoelectric Actuators," Review of Scientific Instruments, 80(12) pp. 126103.
Ivan, I. A., Rakotondrabe, M., Lutz, P., 2009, "Quasistatic Displacement Self-Sensing Method for Cantilevered Piezoelectric Actuators," Review of Scientific Instruments, 80(6) pp. 065102.
James, S., and Sundaram, M. M., 2014, "Modeling of Tool Wear in Vibration Assisted Nano Impact-Machining by Loose Abrasives," International Journal of Manufacturing Engineering, 9 pages.
Juretschko, S., Loy, A., Lehner, A., 2002, "The Microbial Community Composition of a Nitrifying-Denitrifying Activated Sludge from an Industrial Sewage Treatment Plant Analyzed by the Full-Cycle rRNA Approach," Systematic and Applied Microbiology, 25(1) pp. 84-99.
Kalinin, S. V., Rodriguez, B. J., Jesse, S., 2007, "Towards Local Electromechanical Probing of Cellular and Biomolecular Systems in a Liquid Environment," Nanotechnology, 18(42) pp. 10 pp.
Kasemo, B., 2002, "Biological Surface Science," Surface Science, 500(1-3) pp. 656-677.
Kato, Z., Sakairi, M., and Takahashi, H., 2003, "Nanopatterning on Aluminum Surfaces with AFM Probe," Surface and Coatings Technology, 169pp. 195-198.
Keren, K., Krueger, M., Gilad, R., 2002, "Sequence-Specific Molecular Lithography on Single DNA Molecules," Science, 297(5578) pp. 72-75.
Kim, S., Ratchford, D. C., and Li, X., 2009, "Atomic Force Microscope Nanomanipulation with Simultaneous Visual Guidance," ACS Nano, 3(10) pp. 2989-2994.

(56) References Cited

OTHER PUBLICATIONS

Kim, Y., and Lieber, C. M., 1992, "Machining Oxide Thin Films with an Atomic Force Microscope: Pattern and Object Formation on the Nanometer Scale," Science (New York, N.Y.), 257(5068) pp. 375-377.

Klehn, B., and Kunze, U., 1999, "Nanolithography with an Atomic Force Microscope by Means of Vector-Scan Controlled Dynamic Plowing," Journal of Applied Physics, 85(7) pp. 3897-3903.

Kobayashi, T., Ichiki, M., Kondou, R., 2008, "Fabrication of Piezoelectric Microcantilevers using LaNiO3 Buffered Pb(Zr,Ti)O3 Thin Film," Journal of Micromechanics and Microengineering, 18,. 5pp. 035007.

Kucera, M., Manzaneque, T., Sánchez-Rojas, J., 2013, "Q-Factor Enhancement for Self-Actuated Self-Sensing Piezoelectric MEMS Resonators Applying a Lock-in Driven Feedback Loop," Journal of Micromechanics and Microengineering, 23, 8pp., 085009.

Kueppers, H., Hoffmann, M., Leuerer, T., 2001, "Basic Investigations on a Piezoelectric Bending Actuator for Micro-Electro-Mechanical Applications," Integrated Ferroelectrics, 35(1-4) pp. 269-281.

Lee, C., Itoh, T., and Suga, T., 1999, "Self-Excited Piezoelectric PZT Microcantilevers for Dynamic SFM—with Inherent Sensing and Actuating Capabilities," Sensors and Actuators A: Physical, 72(2) pp. 179-188.

Lee, C., Wei, X., Kysar, J. W., 2008, "Measurement of the Elastic Properties and Intrinsic Strength of Monolayer Graphene," Science (New York, N.Y.), 321(5887) pp. 385-388.

Lee, S. H., Lee, S. S., Choi, J., 2005, "Fabrication of a ZnO Piezoelectric Micro Cantilever with a High-Aspect-Ratio Nano Tip," Microsystem Technologies, 11(6) pp. 416-423.

Lee, S. I., Howell, S. W., Raman, A., 2002, "Nonlinear Dynamics of Microcantilevers in Tapping Mode Atomic Force Microscopy: A Comparison between Theory and Experiment," Physical Review B (Condensed Matter and Materials Physics), 66(11) pp. 115409-1.

Li, G., Xi, N., Chen, H., 2004, "Nano-assembly of DNA based electronic devices using atomic force microscopy," Intelligent Robots and Systems, 2004.(IROS 2004). Proceedings. 2004 IEEE/RSJ International Conference on, IEEE, 1, pp. 583-588.

Liao, A. D., Araujo, P. T., Xu, R., 2014, "Carbon Nanotube Network-Silicon Oxide Non-Volatile Switches," Nature Communications, 5, 6 pages.

Liu, Z., Li, Z., Wei, G., 2006, "Manipulation, Dissection, and Lithography using Modified Tapping Mode Atomic Force Microscope," Microscopy Research and Technique, 69(12) pp. 998-1004.

Lü, J., Li, H., An, H., 2004, "Positioning Isolation and Biochemical Analysis of Single DNA Molecules Based on Nanomanipulation and Single-Molecule PCR," Journal of the American Chemical Society, 126(36) pp. 11136-11137.

Mahmoodi, S. N., and Jalili, N., 2007, "Non-Linear Vibrations and Frequency Response Analysis of Piezoelectrically Driven Microcantilevers," International Journal of Non-Linear Mechanics, 42(4) pp. 577-587.

Mahmoodi, S. N., and Jalili, N., 2008, "Coupled Flexural-Torsional Nonlinear Vibrations of Piezoelectrically Actuated Microcantilevers with Application to Friction Force Microscopy," Journal of Vibration and Acoustics, 130(6) pp. 061003.

Mahmoodi, S. N., and Jalili, N., 2009, "Piezoelectrically Actuated Microcantilevers: An Experimental Nonlinear Vibration Analysis," Sensors and Actuators, A: Physical, 150(1) pp. 131-136.

Mahmoodi, S. N., Daqaq, M. F., and Jalili, N., 2009, "On the Nonlinear-Flexural Response of Piezoelectrically Driven Microcantilever Sensors," Sensors and Actuators, A: Physical, 153(2) pp. 171-179.

Mahmoodi, S. N., Jalili, N., and Ahmadian, M., 2010, "Subharmonic resonances of piezoelectrically actuated microcantilevers," 2009 ASME Dynamic Systems and Control Conference, DSCC2009, Oct. 12, 2009-Oct. 14, American Society of Mechanical Engineers, Hollywood, CA, United states, pp. 1445-1452.

Mahmoodi, S. N., Jalili, N., and Ahmadian, M., 2010, "Subharmonics Analysis of Nonlinear Flexural Vibrations of Piezoelectrically Actuated Microcantilevers," Nonlinear Dynamics, 59(3) pp. 397-409.

Manalis, S. R., Minne, S. C., and Quate, C. F., 1996, "Atomic Force Microscopy for High Speed Imaging using Cantilevers with an Integrated Actuator and Sensor," Applied Physics Letters, 68(6) pp. 871-873.

Marinello, F., Bariani, P., Carmignato, S., 2009, "Geometrical Modelling of Scanning Probe Microscopes and Characterization of Errors," Measurement Science and Technology, 20(8), 9 pages.

McCarty, R., and Mahmoodi, S. N., 2014, "Frequency Response Analysis of Nonlinear Tapping-Contact Mode Atomic Force Microscopy," Proceedings of the Institution of Mechanical Engineers, Part C: Journal of Mechanical Engineering Science, pp. 1-12, DOI: 10.1177/0954406214533676.

McCarty, R., and Mahmoodi, S. N., 2014, "Nonlinear forced response of piezoelectric microcantilevers with application to tapping mode atomic force microscopy," SPIE Smart Structures and Materials Nondestructive Evaluation and Health Monitoring, International Society for Optics and Photonics, pp. 905722-905722-13.

McCarty, R., and Mahmoodi, S. N., 2014, "Parameter Sensitivity Analysis of Nonlinear Piezoelectric Probe in Tapping Mode Atomic Force Microscopy for Measurement Improvement," Journal of Applied Physics, 115(7), pp. 10.

McCarty, R., and Mahmoodi, S. N., 2015, "Dynamic Mulitmode Analysis of Non-Linear Piezoelectric Microcantilever Probe in Bistable Region of Tapping Mode Atomic Force Microscopy," International Journal of Non-Linear Mechanics, 74pp. 25-37.

McCarty, R., Carmichael, B., and Mahmoodi, S. N., 2014, "Dynamic Analysis of Tapping Atomic Force Microscopy Considering various Boundary Value Problems," Sensors and Actuators, A: Physical, 216pp. 69-77.

McCarty, R., Sheik, M. H., Hodges, K., 2013, "Vibration of Atomic Force Microscopy Using Hamilton's Principle," Proceeding of the 2013 ASME—District F Early Career Technical Conference (ECTC), Birmingham, AL., pp. 46.

Mendez-Vilas, A., Bruque, J. M., and Gonzalez-Martin, M., 2007, "Sensitivity of Surface Roughness Parameters to Changes in the Density of Scanning Points in Multi-Scale AFM Studies. Application to a Biomaterial Surface," Ultramicroscopy, 107(8) pp. 617-625.

Meng, Q., Mehregany, M., and Deng, K., 1993, "Modeling of the Electromechanical Performance of Piezoelectric Laminated Microactuators," Journal of Micromechanics and Microengineering, 3(1) pp. 18-23.

Mengwei Liu, Cui, T., and Liding Wang, 2007, "Fabrication and Characterization of the Piezoelectric Microcantilever Integrated with PZT Thin-Film Microforce Sensor and Actuator," Solid-State Sensors, Actuators and Microsystems Conference, 2007. Transducers 2007. International, pp. 2255-2258.

Miyahara, Y., Deschler, M., Fujii, T., 2002, "Non-Contact Atomic Force Microscope with a PZT Cantilever used for Deflection Sensing, Direct Oscillation and Feedback Actuation," Applied Surface Science, 188(3-4) pp. 450-455.

Mokaberi, B., Yun, J., Wang, M., 2007, "Automated nanomanipulation with atomic force microscopes," Proceedings—IEEE International Conference on Robotics and Automation, pp. 1406-1412.

Negishi, N., 2003, Elliptical Vibration Assisted Machining with Single Crystal Diamond Tools, 217 pages.

Odom, T. W., Huang, J., Kim, P., 1998, "Atomic Structure and Electronic Properties of Single-Walled Carbon Nanotubes," Nature, 391(6662) pp. 62-64.

Oesterschulze, E., Malave, A., Keyser, U. F., 2002, "Diamond cantilever with integrated tip for nanomachining," 12th European Conference on Diamond, Diamond-like Materials, Carbon Nanotubes, Nitrides and Silicon Carbide (Diamond 2001), Elsevier, Netherlands, 11, pp. 667-671.

Omidi, E., and Mahmoodi, S. N., 2014, "Hybrid Positive Feedback Control for Active Vibration Attenuation of Flexible Structures," IEEE/ASME Transactions on Mechatronics, Accepted for publication, DOI: 10.1109/TMECH.2014.2354599.

(56) References Cited

OTHER PUBLICATIONS

Omidi, E., and Mahmoodi, S. N., 2014, "Vibration Control of Collocated Smart Structures using $\mathcal{H}\infty$ modified Positive Position and Velocity feedback," Journal of Vibration and Control, Accepted for publication,19 pages DOI: 10.1177/1077546314548471.
Omidi, E., and Mahmoodi, S. N., 2015, "Consensus Positive Position Feedback Control for Vibration Attenuation of Smart Structures," Smart Materials and Structures, 24(4) 25 pages, 045016.
Omidi, E., and Mahmoodi, S. N., 2015, "Nonlinear Vibration Suppression of Flexible Structures using Nonlinear Modified Positive Position Feedback Approach," Nonlinear Dynamics, 79(2) pp. 835-849.
Omidi, E., and Mahmoodi, S. N., 2015, "Sensitivity Analysis of the Nonlinear Integral Positive Position Feedback and Integral Resonant Controllers on Vibration Suppression of Nonlinear Oscillatory Systems," Communications in Nonlinear Science and Numerical Simulation, 22(1-3) pp. 149-166.
Omidi, E., Korayem, A. H., and Korayem, M. H., 2013, "Sensitivity Analysis of Nanoparticles Pushing Manipulation by AFM in a Robust Controlled Process," Precision Engineering, 37(3) pp. 658-670.
Park, S. S., Mostofa, M. G., Park, C. I., 2014, "Vibration Assisted Nano Mechanical Machining using AFM Probe," CIRP Annals—Manufacturing Technology, 63(1) pp. 537-540.
Patil, N., Deng, J., Lin, A., 2008, "Design Methods for Misaligned and Mispositioned Carbon-Nanotube Immune Circuits," IEEE Transactions on Computer-Aided Design of Integrated Circuits and Systems, 27(10) pp. 1725-1736.
Patil, N., Lin, A., Myers, E. R., 2008, "Integrated wafer-scale growth and transfer of directional carbon nanotubes and misaligned-carbon-nanotube-immune logic structures," 2008 Symposium on VLSI Technology, IEEE, Piscataway, NJ, USA, pp. 205-206.
Patil, N., Lin, A., Myers, E. R., 2009, "Wafer-Scale Growth and Transfer of Aligned Single-Walled Carbon Nanotubes," IEEE Transactions on Nanotechnology, 8(4) pp. 498-504.
Rogers, B., Manning, L., Jones, M., 2003, "Mercury Vapor Detection with a Self-Sensing, Resonating Piezoelectric Cantilever," Review of Scientific Instruments, 74(11) pp. 4899-4901.
Rogers, B., Manning, L., Sulchek, T., 2004, "Improving Tapping Mode Atomic Force Microscopy with Piezoelectric Cantilevers," Ultramicroscopy, 100(3) pp. 267-276.
Rogers, B., Sulchek, T., Murray, K., 2003, "High Speed Tapping Mode Atomic Force Microscopy in Liquid using an Insulated Piezoelectric Cantilever," Review of Scientific Instruments, 74(11) pp. 4683-4686.
Rollier, A., Jenkins, D., Dogheche, E., 2010, "Development of a New Generation of Active AFM Tools for Applications in Liquids," Journal of Micromechanics and Microengineering, 20(8) pp. 085010.
Rosa, J. C., Wendel, M., Lorenz, H., 1998, "Direct Patterning of Surface Quantum Wells with an Atomic Force Microscope," Applied Physics Letters, 73(18) pp. 2684-2686.
Rosenbluth, M. J., Crow, A., Shaevitz, J. W., 2008, "Slow Stress Propagation in Adherent Cells," Biophysical Journal, 95(12) pp. 6052-6059.
San Paulo, A., and Garcia, R., 2002, "Unifying Theory of Tapping-Mode Atomic-Force Microscopy," Physical Review B (Condensed Matter and Materials Physics), 66(4) pp. 041406-1.
Satoh, N., Kobayashi, K., Watanabe, S., 2002, "Dynamic-Mode AFM using the Piezoelectric Cantilever: Investigations of Local Optical and Electrical Properties," Applied Surface Science, 188(3-4) pp. 425-429.
Schumacher, H., Keyser, U., Zeitler, U., 1999, "Nanomachining of Mesoscopic Electronic Devices using an Atomic Force Microscope," Applied Physics Letters, 75(8) pp. 1107-1109.
Sekiguchi, Y., Kamagata, Y., Nakamura, K., 1999, "Fluorescence in Situ Hybridization using 16S rRNA-Targeted Oligonucleotides Reveals Localization of Methanogens and Selected Uncultured Bacteria in Mesophilic and Thermophilic Sludge Granules," Applied and Environmental Microbiology, 65(3) pp. 1280-1288.
Shahi, A. A. M., Zarkesh-Ha, P., and Elahi, M., 2012, "Comparison of variations in MOSFET versus CNFET in gigascale integrated systems," 2012 13th International Symposium on Quality Electronic Design (ISQED 2012), IEEE, Piscataway, NJ, USA, pp. 378-383.
Shibata, T., Unno, K., Makino, E., 2002, "Characterization of Sputtered ZnO Thin Film as Sensor and Actuator for Diamond AFM Probe," Sensors and Actuators A: Physical, 102(1) pp. 106-113.
Shibata, T., Unno, K., Makino, E., 2004, "Fabrication and characterization of diamond AFM probe integrated with PZT thin film sensor and actuator," IEEE International Solid-State Sensors and Actuators Conference, Elsevier, Switzerland, A114, pp. 398-405.
Shin, C., Jeon, I., Khim, Z. G., 2010, "Study of Sensitivity and Noise in the Piezoelectric Self-Sensing and Self-Actuating Cantilever with an Integrated Wheatstone Bridge Circuit," Review of Scientific Instruments, 81(3) pp. 035109.
Skaberna, S., Versen, M., Klehn, B., 2000, "Fabrication of a Quantum Point Contact by the Dynamic Plowing Technique and Wet-Chemical Etching," Ultramicroscopy, 82(1) pp. 153-157.
Unno, K., Shibata, T., and Makino, E., 2001, "Micromachining of Diamond Probes for Atomic Force Microscopy Applications," Sensors and Actuators A (Physical), A88(3) pp. 247-255.
Uosaki, K., and Koinuma, M., 1993, "Atomic Imaging of an InSe Single-Crystal Surface with Atomic Force Microscope," Journal of Applied Physics, 74(3) pp. 1675-1678.
Vasić, B., Kratzer, M., Matković, A., 2013, "Atomic Force Microscopy Based Manipulation of Graphene using Dynamic Plowing Lithography," Nanotechnology, 24(1) pp. 015303.
Villarrubia, J. S., 1997, "Algorithms for Scanned Probe Microscope Image Simulation, Surface Reconstruction, and Tip Estimation," Journal of Research of the National Institute of Standards and Technology, 102(4) pp. 425-454.
Vogl, W., Sitti, M., and Zäh, M. F., 2004, "Nanomanipulation with 3D visual and force feedback using atomic force microscopes," 2004 4th IEEE Conference on Nanotechnology, pp. 349-351.
Wang, Z., Tan, J., Zou, Q., 2013, "Mechanical-Plowing-Based High-Speed Patterning on Hard Material Via Advanced-Control and Ultrasonic Probe Vibration," Review of Scientific Instruments, 84(11) pp. 113704.
Wei-Chih Lin, Chao-Chiun Liang, Ching-Hsiang Tsai, 2005, "A liquid-based gravity-driven etching-stop technique and its application to wafer level cantilever thickness control of AFM probes," 18th IEEE International Conference on Micro Electro Mechanical Systems, IEEE, Piscataway, NJ, USA, pp. 500-503.
Wolf, K., and Gottlieb, O., 2002, "Nonlinear Dynamics of a Noncontacting Atomic Force Microscope Cantilever Actuated by a Piezoelectric Layer," Journal of Applied Physics, 91(7) pp. 4701-4709.
Xie, H., Haliyo, D. S., and Regnier, S., 2009, "A Versatile Atomic Force Microscope for Three-Dimensional Nanomanipulation and Nanoassembly," Nanotechnology, 20(21), 215301 (9 pp).
Xiong, F., Liao, A. D., Estrada, D., 2011, "Low-Power Switching of Phase-Change Materials with Carbon Nanotube Electrodes," Science, 332(6029) pp. 568-570.
Yan, Y., Sun, T., and Dong, S., 2007, "Study on Effects of Tip Geometry on AFM Nanoscratching Tests," Wear, 262(3) pp. 477-483.
Yan, Y., Sun, T., Liang, Y., 2007, "Investigation on AFM-Based Micro/Nano-CNC Machining System," International Journal of Machine Tools and Manufacture, 47(11) pp. 1651-1659.
Yan, Y., Sun, T., Zhao, X., 2008, "Fabrication of Microstructures on the Surface of a Micro/Hollow Target Ball by AFM," Journal of Micromechanics and Microengineering, 18(3) pp. 035002.
Yin, S., and Shinmura, T., 2004, "Vertical Vibration-Assisted Magnetic Abrasive Finishing and Deburring for Magnesium Alloy," International Journal of Machine Tools and Manufacture, 44(12) pp. 1297-1303.
Zhang, J., Bobba, S., Patil, N., 2010, "Carbon nanotube correlation: promising opportunity for CNFET circuit yield enhancement," Proceedings of the 47th Design Automation Conference, ACM, pp. 889-892.

(56) References Cited

OTHER PUBLICATIONS

Zhang, J., Lin, A., Patil, N., 2012, "Robust Digital VLSI using Carbon Nanotubes," IEEE Transactions on Computer-Aided Design of Integrated Circuits and Systems, 31(4) pp. 453-471.

Zhang, L., and Dong, J., 2012, "High-Rate Tunable Ultrasonic Force Regulated Nanomachining Lithography with an Atomic Force Microscope," Nanotechnology, 23(8) pp. 085303.

Zhang, L., Dong, J., and Cohen, P. H., 2013, "Material-Insensitive Feature Depth Control and Machining Force Reduction by Ultrasonic Vibration in AFM-Based Nanomachining," Nanotechnology, IEEE Transactions On, 12(5) pp. 743-750.

Zhang, Y., Chen, S., Ouyang, Z., 2000, "Stretching and Imaging Studies of Single DNA Molecules," Chinese Science Bulletin, 45(15) pp. 1365-1368.

Zhang, Y., Fang, Y., Yu, J., 2011, "Note: A Novel Atomic Force Microscope Fast Imaging Approach: Variable-Speed Scanning," Review of Scientific Instruments, 82(5), 056103.

Zheng, H., and Huang, H., 2007, "Ultrasonic Vibration-Assisted Femtosecond Laser Machining of Microholes," Journal of Micromechanics and Microengineering, 17(8) pp. N58-N61.

Zhong, Z. W., and Lu, Y. G., 2004, "An AFM Scanning Moire Technique for the Inspection of Surface Deformations," International Journal of Advanced Manufacturing Technology, 23(5-6) pp. 462-466.

Zhou, J., Li, P., Zhang, S., 2003, "Self-Excited Piezoelectric Microcantilever for Gas Detection," Microelectronic Engineering, 69(1) pp. 37-46.

Zhou, J., Li, P., Zhang, S., 2003, "Zeolite-Modified Microcantilever Gas Sensor for Indoor Air Quality Control," Sensors and Actuators B: Chemical, 94(3) pp. 337-342.

\* cited by examiner

DYNAMIC SWEEP-PLOW MICROCANTILEVER DEVICE AND METHODS OF USE

CROSS REFERENCE TO RELATED APPLICATION

This application claims priority to U.S. Patent Application Ser. No. 62/271,092, entitled "Dynamic Sweep-Plow Microcantilever Device and Methods of Use," and filed Dec. 22, 2015, the content of which is herein incorporated by reference in its entirety.

BACKGROUND

Single armed microcantilevers have been used for sensing purposes in different devices. For example, scanning probe microscopes (SPMs) are a series of these devices that benefit from micro-probes. In SPMs typically, a microcantilever is moved over the surface of the sample, taps on the sample at a high frequency, or applies a miniscule force on a certain part of the sample. Conventional application of the SPMs is to produce topography of surfaces of different samples. With some modifications in elements of the SPM, it can also be used for measurements in materials with specific magnetic or electrical properties. Other examples include biological applications of SPMs for study of DNA and RNA, and investigation of structure and formation of carbon nanotube-based units.

Atomic force microscopes (AFMs) are a well-known and frequently used type of SPMs. AFMs were initially built for generating three-dimensional (3D) images from surfaces in nano-scale. FIG. 1 illustrates a schematic representation of different elements of an AFM. The stage holding the sample is moved upwards, until the microcantilever and the sample are engaged. Next, the piezoelectric stage moves in a planar motion to scan the considered surface. The reflected laser beam from the tip of the cantilever provides the required feedback of the sample surface topography. Different research has been conducted in this field. For example, methods for scanning the topography of a heterogeneous surface using AFMs have been proposed and utilized. In addition to common imaging application of the AFM, it has been used to measure mechanical properties of different materials and as a bio-sensor. Its ability to work in liquid environment makes the AFM an important tool for studying and even modifying biological samples. AFMs have been also used for nano-manipulation, where a nano-scale object on a sample is deformed or displaced.

Although AFMs were initially designed for generating images from surfaces in nano-scale, they have been used to manipulate and modify objects. Tip radius of less than 10 nm in the microcantilever probe accompanied with a stage which can move in nano-precision has made the AFM a suitable tool for different micro- and nano-machining applications. In particular, a microcantilever with a sharp tip is the cutting tool. The sample is placed on a piezoelectric-tube stage under the microcantilever. The stage pushes the sample into the microcantilever tip and then moves the sample so the tip plows the sample. For example, dynamic plowing lithography is a set of direct machining processes in which the microcantilever tip is vibrated at its resonant or higher frequencies using the piezo-stage under the sample, while the mechanical plowing is being performed.

However, the vibration amplitude is not accurately controllable using the piezoelectric stage in current machining works, which results in an inability to control the depth of the groove. As a result, the outcome of the process becomes less predictable, and the system cannot produce the desired shape and form of the channel or required object. In addition, the machining tool must penetrate into the sample, which eliminates the chance of fine machining in order of micron or submicron.

Among different nano-lithography approaches using the AFM, direct mechanical scratching is one of the simplest and most practical methods to cut a furrow, or even create 3D nano-scale objects. In the plowing process, the tip of the microcantilever is pressed into the sample, and using the motion of the stage, the desired groove is created on the surface. Ideally, the normal force would be kept constant to create a homogeneous groove by using the feedback provided by a reflected laser beam from the tip of the microcantilever.

Piezoelectric materials have been used in conventional one-armed microcantilevers of SPMs both for sensing and actuation applications. For sensing purposes, a layer of piezoelectric material, which is usually zinc oxide (ZnO) or lead zirconate titanate (PZT) is deposited on one side of the microcantilever. The piezoelectric microcantilever has been used in bio-sensing and chemical sensing for force microscopy, in addition to surface scanning and imaging of different samples in SPMs. When piezoelectric microcantilevers are used as actuators, they offer a much larger actuation bandwidth than that of conventional piezotubes. Piezoelectric microcantilevers can be excited in high frequencies to conduct the desired task. Due to the fact that the excitation input is applied directly to the microcantilever from the piezoelectric layer rather than by an interaction force at the tip or base excitation in conventional methods, they are more controllable and respond more quickly. However, piezoelectric microcantilevers have not been used in nano-machining processes.

Thus, there is a need in the art for an improved microcantilever device.

BRIEF SUMMARY

According to various implementations, a dynamic sweep plow microcantilever device includes a first elongated cantilevered arm and a second elongated cantilevered arm. The first cantilevered arm has a first proximal end, a first distal end, a first upper surface, and a first lower surface, wherein the first upper and lower surfaces extend between the first proximal and distal ends and are spaced apart from each other and face opposite directions. The second elongated cantilevered arm has a second proximal end, a second distal end, a second upper surface, and a second lower surface, wherein the second upper and lower surfaces extend between the second proximal and distal ends and are spaced apart from each other and face opposite directions. The device also includes a first piezoelectric layer disposed on the first upper surface, a second piezoelectric layer disposed on the second upper surface, and a distal tip coupled to the first and second distal ends. A distal end of the distal tip extends below a plane that includes the first and second lower surfaces. The first and second proximal ends are coupled to a base and are spaced apart from each other. The first piezoelectric layer is electrically coupled to first base electrodes, and the second piezoelectric layer is electrically coupled to second base electrodes. Electrical inputs to the first and second piezoelectric layers that have the same amplitude and in-phase frequency cause the distal tip to vibrate vertically. Electrical inputs that have the same amplitude and 180° out of phase frequency cause the distal tip to vibrate laterally. And, electrical inputs that have a combination of a first input and a second input cause the distal tip to vibrate laterally and rotationally (3D vibration), wherein the first input has the same amplitude and in-phase frequency and the second input has the same amplitude and 180° out of phase frequency.

The first and second elongated cantilevered arms may extend parallel to each other according to some implementations. In addition, the arms may intersect each other at their distal ends.

In some implementations, distal tip may have a triangular prism shape, a pyramidal shape, a cone shape, or a spherical shape.

In some implementations, the distal tip may be formed by etching. In other implementations, the distal tip may be formed separately and attached to the distal ends of the arms.

In addition, the device may also include a third piezoelectric layer disposed on the first lower surface and a fourth piezoelectric layer disposed on the second lower surface. The third piezoelectric layer may be electrically coupled to a third base electrode, and the fourth piezoelectric layer may be electrically coupled to a fourth base electrode.

The base of the device may be coupled to an atomic force microscope, according to some implementations.

The first and/or second elongated cantilevered arms may be vibrated at a frequency, such as for example, a resonance frequency or an ultrasonic frequency, according to some implementations. In addition, the device may further include a microprocessor in electrical communication with the first and second base electrodes. The microprocessor may be configured for increasing the vibration frequency to increase the vertical and/or torsional movement of the distal tip or decreasing the vibration frequency to decrease the vertical and/or torsional movement of the distal tip.

In some implementations, the first and second piezoelectric layers are the same. And, in some implementations, the first and second piezoelectric layers are different.

In various implementations, a dynamic sweep plow microcantilever device includes first and second elongated cantilevered arms. The first elongated cantilevered arm has a first proximal end, a first distal end, a first upper surface, and a first lower surface, wherein the first upper and lower surfaces extend between the first proximal and distal ends and are spaced apart from each other and face opposite directions. The second elongated cantilevered arm has a second proximal end, a second distal end, a second upper surface, and a second lower surface, wherein the second upper and lower surfaces extend between the second proximal and distal ends and are spaced apart from each other and face opposite directions. A first piezoelectric layer is disposed on the first upper surface, and a second piezoelectric layer is disposed on the second upper surface. A distal tip is coupled to the first and second distal ends, and a distal end of the distal tip extends below a plane that includes the first and second lower surfaces. The first and second proximal ends are coupled to a base and are spaced apart from each other. In addition, the first piezoelectric layer is electrically coupled to first base electrodes, and the second piezoelectric layer is electrically coupled to second base electrodes. Electrical inputs are generated by the first and second piezoelectric layers in response to flexural and/or torsional movement of the distal tip caused by a three-dimensional surface in contact with the distal tip, and a microprocessor in electrical communication with the first and second piezoelectric layers receives the generated electrical inputs and identifies a topography of the three-dimensional surface.

DETAILED DESCRIPTION

Various implementations include a dynamic sweep-plow microcantilever (DSPM) device for nano-machining and nano-manufacturing using AFMs or other SPMs. The DSPM device may include two elongated cantilevered arms that are spaced apart at their proximal ends and on which a piezoelectric layer is disposed on either one or both sides of the arms. The distal ends of the arms are coupled together, and a distal tip is coupled to the distal ends and extends below a plane that includes a lower surface of the arms. The design may also be in-plane for the two arms and the coupling section, and a sharp tip later attached to it. The DSPM device is mounted on the AFM or other SPM and applies the nano-machining force through vibration that is induced by the piezoelectric layers on the arms. The DSPM device can vibrate such that the tip undergoes one or both of bending and torsional vibrations, which allows the DSPM device to perform both plowing and/or sweeping in nano-scale.

A primary application of the DSPM device may be in modifying objects and surfaces in nano-scale, in addition to 3D nano-manufacturing. The DSPM device may be used in so-called vibration-assisted processes in which the assisting vibration reduces a required amount of normal force, tool wear, machining time and torsional stresses on the tools. Eliminating these drawbacks results in a highly-accurate nano-machining process.

Figure 1:
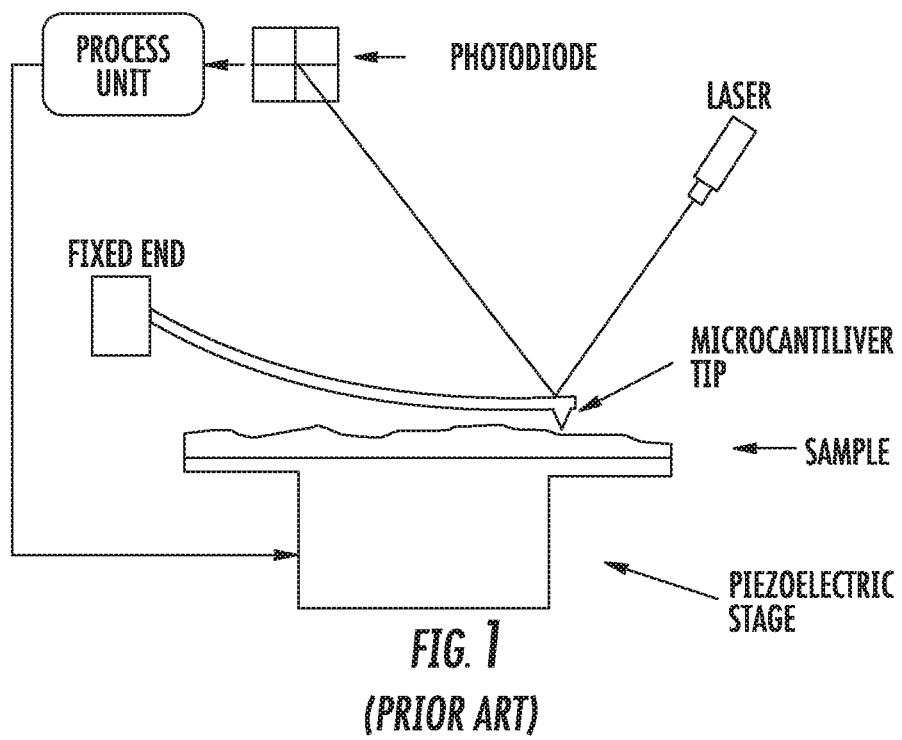
FIG. 1 illustrates a prior art atomic force microscope cantilevered tip.

In addition to its applications in nano-manufacturing, the DSPM may be used for imaging purposes and frictional measurement using AFMs. The piezoelectric layers on each of the arms of the DSPM may generate the required bending and/or torsional vibration but with lower amplitude such that the tip does not penetrate the sample. The DSPM tip taps over the sample and the reflected laser beam from the tip is collected by the photodiode sensor shown in FIG. 1. As a result, both changes in bending and torsional vibrations of the tip are measured and used to generate the 3D image of regular surfaces and rough surfaces that cannot be scanned using conventional microcantilevers.

In the DSPM device according to various implementations, all required assisting vibration components are augmented in the tool itself, and this vibration is used as the major source of machining force. As mentioned above, piezoelectric layers are disposed on each arm of the DSPM device. To generate the bending vibration, both piezo-layers are actuated by electrical inputs with the same harmonic in-phase amplitudes and frequencies. This mode may be more applicable for cutting furrows and nano-channels on samples. In another mode, the piezo-layers are actuated with inputs of the same amplitudes and frequencies, but anti-phase (180 degrees of phase difference). As a result, when one arm is bent upwards, the other one is bent downwards, and the tip of the DSPM device twists, with its bottom point as its initial position. This mode may be practical for material removal from surfaces without cutting into the substrate, cutting nano-wires and carbon nanotubes, and biological samples and DNA dissection. In a third mode of operation, both bending and twisting modes are induced on the DSPM device by the piezo-actuators, which may be useful for high-volume material removal and 3D nano-manufacturing. In this mode, combinations of harmonic inputs are applied to each of the active arms that may have different frequencies, different amplitudes, and different phase shifts. The result is the desired form of the 3D vibrations at the tip that the user may require.

The DSPM device with its double actuation power is fully controllable, and it can generate the desired tip motion trajectory. Additionally, it can be vibrated at its resonance, or ultrasonic frequencies. When vibrated ultrasonically, the obtained machining depth increases and the DSPM device can tackle problems of machining harder surfaces. Active control of the vibration amplitude as another feature of the DSPM device enables controlling of the nano-machining depth at different machining locations using the vibration. Hence, in one single machining process, multi-level scratching and material removal is achievable, which is very practical for 3D nano-manufacturing and reducing the machining time.

Figure 2:
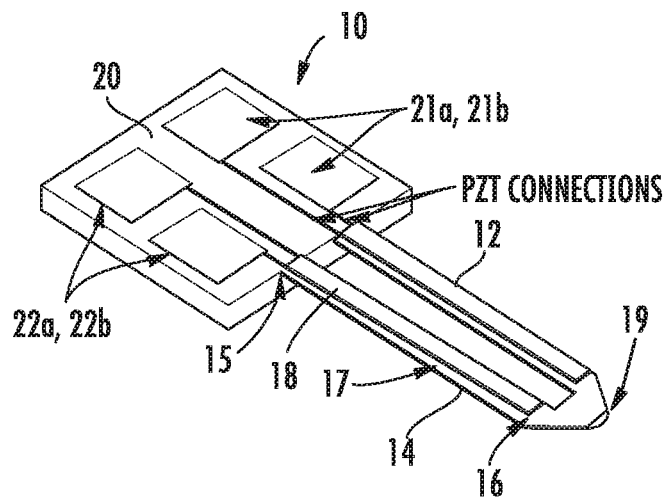
FIG. 2 illustrates a schematic of a dynamic sweep plow microcantilever (DSPM) device according to one implementation.

FIG. 2 illustrates an exemplary implementation of a DSPM device. The DSPM device 10 includes a first elongated cantilevered arm 12 and a second elongated cantilevered arm 14. The arms 12, 14 extend parallel to each other. Each arm 12, 14 has a proximal end 15, a distal end 16, a lower surface 17, and an upper surface. The lower 17 and upper surfaces extend between the respective proximal 15 and distal ends 16 and are spaced apart from each other and face opposite directions. A piezoelectric layer 18 is disposed on the lower surface 17 of each arm 12, 14. The distal ends 16 are coupled together, and a distal tip 19 is coupled to the distal ends 16. The distal tip 19 extends below a plane that includes the lower surface 17. The proximal ends 15 are coupled to a base 20 and are spaced apart from each other. The piezoelectric layer 18 on the first elongated cantilevered arm 12 is electrically coupled to first base electrodes 21a, 21b, and the piezoelectric layer 18 on the second elongated cantilevered arm 14 is electrically coupled to second base electrodes 22a, 22b. PZT connections extend between the piezoelectric layers 18 and the respective base electrodes 21a, 21b, 22a, 22b. The base 20, for example, may be coupled to an AFM.

As shown in FIG. 2, the distal tip 19 has a triangular prism shape. However, in other implementations, the tip may have other suitable shapes, such as a pyramidal shape, a cone shape, or a spherical shape.

Figure 3A:
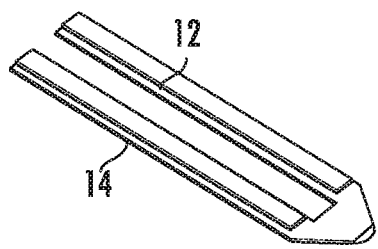
FIG. 3A illustrates the DSPM device of FIG. 2 in a neutral position.
Figure 3B:
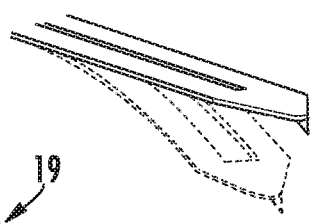
FIG. 3B illustrates the DSPM device of FIG. 2 in flexural motion.
Figure 3C:
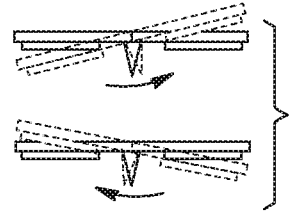
FIG. 3C illustrates the DSPM device of FIG. 2 in torsional motion.

FIG. 3A illustrates the DSPM device 10 shown in FIG. 2 in a neutral position. FIG. 3B illustrates the DSPM device 10 in flexural (or bending) motion in response to the piezoelectric layers 18 receiving electrical inputs that have the same in-phase amplitude and frequency. And, FIG. 3C illustrates the DSPM device 10 in torsional (or lateral) motion in response to the piezoelectric layers 18 receiving electrical inputs that have the same amplitude and frequency and are 180° out of phase. As shown in FIG. 3C, the out of phase electrical signals cause the first arm 12 to twist downwardly while the second arm 14 moves upwardly, and vice versa, which causes the tip 19 to move laterally. Thus, the distal tip 19 of the DSPM device 10 is configured for modifying a surface of a statically held sample, which provides more control over the modification process.

A microprocessor is in electrical communication with the base electrodes 21a, b, and 22a, b and is configured for providing electrical input (e.g., voltage input) to the base electrodes 21a, b, and 22a, b, which increases or decreases the vibration frequency of the piezoelectric layers 18. Increasing vibration frequency increases the vertical and/or torsional movement of the distal tip 19, and decreasing the vibration frequency decreases the vertical and/or torsional movement of the distal tip 19. For example, the elongated cantilevered arms 12, 14 may be vibrated at a resonance frequency or at a higher, ultrasonic frequency.

Figure 4A:
FIGS. 4A-4C, 5, and 6A-6H illustrate steps in a fabrication process for forming the DSPM device shown in FIG. 2.
Figure 4B:
Figure 4C:
Figure 5:
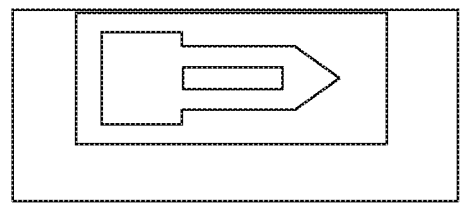

FIGS. 4A-C, 5, and 6A-H illustrate an exemplary process for forming the DSPM device 10. As shown in FIG. 4A, a (0 0 1) oriented silicon wafer is provided. Both sides of the silicon wafer are covered by silicon dioxide ($SiO_2$) using thermal growth. Wet etching of the top surface of the silicon wafer is performed using the standard KOH solution to provide a slope, as shown in FIG. 4B. A layer of $SiO_2$ mask is deposited, as shown in FIG. 4C, in preparation for a deposition of a photoresist mask. FIG. 5 shows a schematic of the photoresist mask. The mask is placed on the surface of the silicon based platform shown in FIG. 4C, and using UV light and chemical process (for example, dry etching in $Ar/CHF_3$ plasma), the inside shape (white) is removed (see FIG. 5). Then, the silicon oxide in the open area is removed by wet etching with hydrofluoric acid (HF).

Figure 6A:
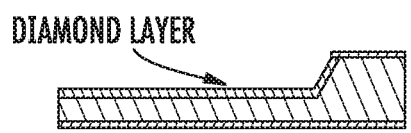
Figure 6E:
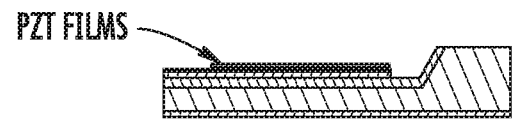
Figure 6B:
Figure 6F:
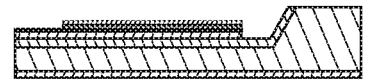
Figure 6C:
Figure 6G:
Figure 6D:
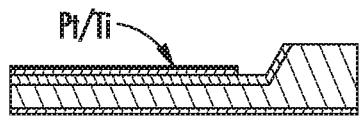
Figure 6H:
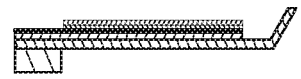

As shown in FIG. 6A, using chemical vapor deposition (CVD), the polycrystalline diamond powder is deposited on the silicon substrate. The $SiO_2$ layer on the top part is then removed, as shown in FIG. 6B. A $SiO_2$ layer is used to cover the top surface to insulate the electrodes from the micro-cantilever by a CVD method, as shown in FIG. 6C. Base electrodes are deposited by RF sputtering method. The electrodes are usually made of platinum (Pt)/titanium (Ti), as shown in FIG. 6D. The Ti thin film enhances the adhesion of the Pt film to the piezoelectric layer. The patterns in this step are formed using lift-off technique. The piezoelectric layer can be zinc oxide or PZT. A PZT layer may be more efficient for the DSPM device 10 when used for machining. The PZT film is made of Zr/Ti and may be prepared using sol-gel process. As shown in FIG. 6E, the PZT layer is spin-coated on the microcantilever. In the next step, the top Pt/Ti electrodes are deposited using sputtering method, as shown in FIG. 6F. At this point the piezoelectric diamond microcantilever is fabricated. The next steps must be performed to remove the substrate from under the microcantilever. However, a part of the substrate is kept as a part of the handling section. FIG. 6G shows the removal of the $SiO_2$ layer up to the handling section. Then, in the final step, the silicon substrate under the microcantilever is removed using deep etching. The isometric view of a schematic of the product is shown in FIG. 2. Further etching of the tip may be necessary for sharpening the diamond tip. This may be determined by SEM images from the microcantilever during the process, then necessary etching is performed. A thorough test of the microcantilever assures the quality of the product. In addition, in other implementations, the distal tip may be separately formed and attached to the distal ends of the elongated cantilevered arms.

In addition, in some alternative implementations, the DSPM device may include piezoelectric layers disposed on both sides of the elongated cantilevered arms. The added piezoelectric layers are electrically coupled to additional base electrodes.

The geometry of the DSPM has an important role in its performance. Thus, the dimensions of the DSPM are selected based on the estimated forces from bending and torsion. The estimated forces are then used to design the DSPM and conduct stress-strain analyses on the design.

Figure 7:
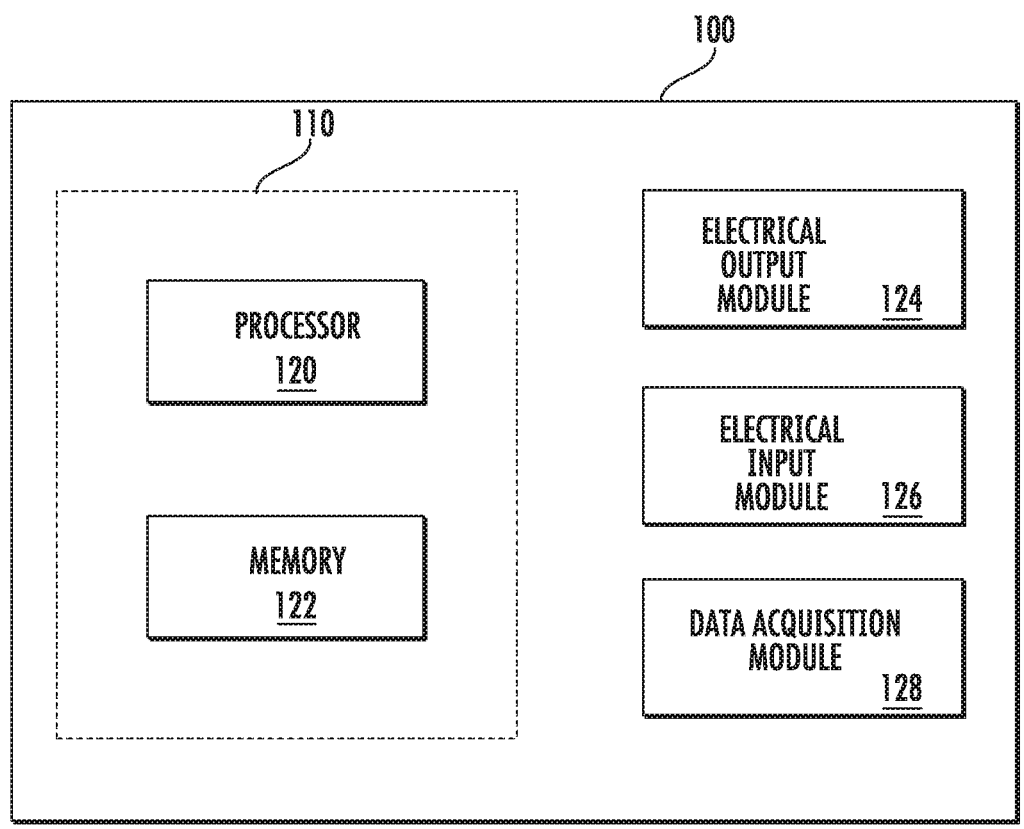
FIG. 7 illustrates a block diagram of a microcontroller for controlling the DSPM device, according to one implementation.

The electrical input to the DSPM device 10 (and the corresponding motion of the tip 19) is controlled by a microcontroller, such as, for example, the microcontroller of the AFM. In the implementation shown in FIG. 7, the microcontroller 100 includes a computing unit 110. In its most basic form, the computing unit 110 includes a processor 120 and a memory 122. The processor 120 is in communication with the memory 122, and the processor 120 executes computer-readable instructions stored on the memory 122 to control the motion of the tip 19. The processor 120 may be a standard programmable processor that performs arithmetic and logic operations necessary for operation of the DSPM device 10. The processor 120 may be configured to execute program code encoded in tangible, computer-readable media. For example, the processor 120 may execute program code stored in the memory 122, which may be volatile or non-volatile memory. The memory 122 is only one example of tangible, computer-readable media. In one aspect, the computing unit 110 can be considered an integrated device such as firmware. Other examples of tangible, computer-readable media include floppy disks, CD-ROMs, DVDs, hard drives, flash memory, or any other machine-readable storage media, wherein when the program code is loaded into and executed by a machine, such as the processor 120, the machine becomes an apparatus for practicing the disclosed subject matter.

The microcontroller 100 includes an electrical output module 124 for communicating a voltage input having a certain amplitude and frequency to the base electrodes 21a, 21b, 22a, 22b at a certain phase. For example, the electrical output module 124 may vary the input voltage signal to each piezoelectric layer 18, which varies the frequency and/or amplitude of the arms 12, 14 and motion of the distal tip 19. For example, increasing the amplitude of the vibration increases a cutting depth possible by the tip 19. Furthermore, increasing the frequency may allow the tip 19 to cut ultra-hard materials, such as tungsten and chromium, and may increase the cutting depth and/or width, depending on the mode of operation. Providing in or out of phase signals to the layers 18 determines the direction of motion of the tip 19, as described above in relation to FIGS. 3 through 3C.

The DSPM 10 is also configured for mapping the topography of a 3D surface. In some implementations, an electrical input module 126 of the microcontroller 100 is configured for receiving a voltage signal from the piezoelectric layers 18 resulting from the tip's 19 movement over the 3D surface and associating the received voltage signal with the movement of the tip 19 to map the topography of the surface.

Figure 8:
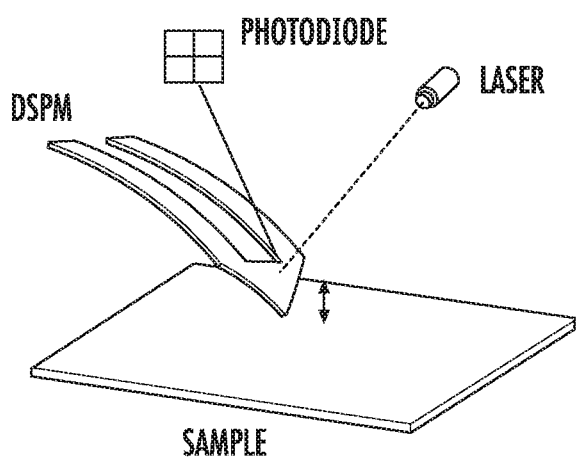
FIG. 8 illustrates the DSPM device of FIG. 2 with a laser and photodiode, according to one implementation.

The microcontroller 100 may also include a data acquisition module 128 that is in electrical communication with an imaging device for tracking the movement of the tip 19. For example, as shown in FIG. 8, the imaging device includes a photodiode that captures a laser beam reflected from the tip 19. The data acquisition module 128 receives data from the photodiode. The module 128 or the processor 120, for example, may also compare the actual movement of tip 19 with the predicted movement and adjust the electrical signals communicated to the base electrodes 21a, 21b, 22a, 22b based on the comparison.

In other implementations, the microcontroller may be separate from the AFM.

Figure 9:
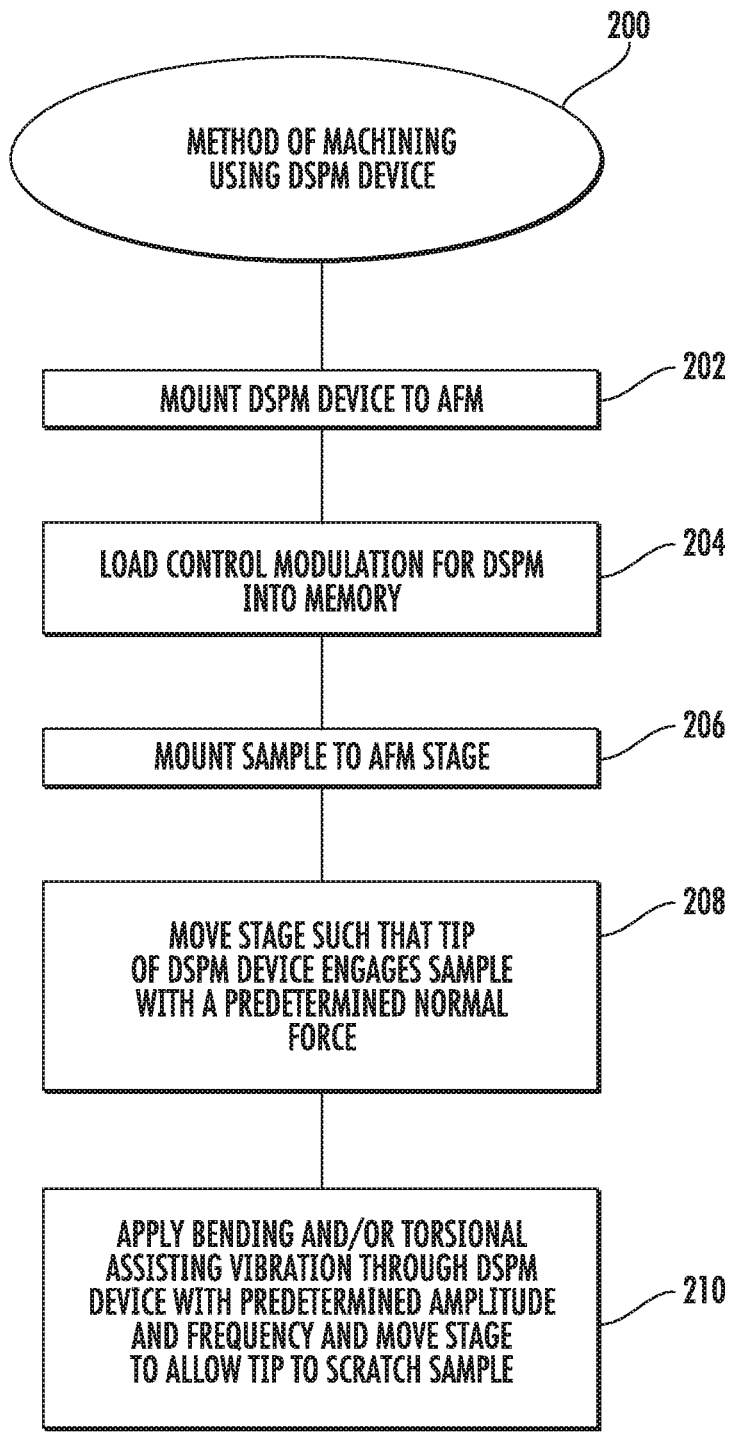
FIG. 9 illustrates a method of machining a sample with the DSPM device of FIG. 2, according to one implementation.

FIG. 9 illustrates an exemplary method of using the DSPM device 10 for machining. The method 200 begins at step 202 with mounting the DSPM device 10 on an AFM. The control modulation for the DSPM device 10 is loaded into the memory in step 204. The control modulation applies the predetermined vibration amplitude and frequency and phase based on the sample to be machined. The sample is mounted on the AFM stage below the tip 19 of the DSPM device 10 in step 206. Steps 202, 204, and 206 may occur in any order and one or more of these steps may occur simultaneously with another step.

In step 208, the piezoelectric-stage is moved such that that the DSPM tip 19 is at the start point of the furrow or the desired shape and is engaged with the sample with the predetermined normal force. This normal force can be held constant, or be variant according to the desired 3D machining map, to obtain different machining levels. Application and control of this normal force is performed using the vertical motion of the piezoelectric-stage on which the sample is mounted and by means of the deflection feedback via an imaging device, such as, for example, the laser sensor shown in FIG. 8.

Next, the bending and/or torsional assisting vibration is applied through the DSPM device 10 with the pre-defined vibration amplitude and frequency, as shown in step 210. The stage is also moved, which helps scratch the surface of the sample according to the expected pattern. Using torsional vibrations with the bending vibrations creates wider furrows, and the cutting is more effective in a lateral direction. In addition, the cutting speed can be controlled by the stage.

The residual material from the surface is removed using an etching process. The etchant is selected based on the material being machined.

In other implementations (not shown), the first and second elongated cantilevered arms do not extend parallel to each other and instead intersect at the distal ends thereof.

Various implementations of the DSPM device make the nano-machining process more controllable, enable machining depth control using the active control of vibration amplitude, generate torsional (or lateral) vibrations on the distal tip, provide for creating wider grooves and better 3D nanomachining process by means of the bending-torsional vibrations of the DSPM tip, and provide for nano-object removal from a surface without indenting it.

The DSPM device is useful for situations in which modifications in nano-scale are required. For example, the DSPM device may be useful is in cutting furrows in surfaces, mask removal for etching, dissection of DNA and other bio-objects, and 3D nano-manufacturing. The DSPM device may also be impactful on assisting with manufacturing of carbon-nanotube (CNT) based integrated circuits (ICs). This powerful and accurate device enables removal of CNTs that are mispositioned in carbon nanotube based transistors (CNFET).

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to implementations of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The terminology used herein is for the purpose of describing particular implementations only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The implementation was chosen and described in order to best explain the principles of the invention and the practical application, and to enable others of ordinary skill in the art to understand the invention for various implementations with various modifications as are suited to the particular use contemplated.

The invention claimed is:

1. A dynamic sweep plow microcantilever device comprising:
   a first elongated cantilevered arm having a first proximal end, a first distal end, a first upper surface, and a first lower surface, wherein the first upper and lower surfaces extend between the first proximal and distal ends and are spaced apart from each other and face opposite directions;
   a second elongated cantilevered arm having a second proximal end, a second distal end, a second upper surface, and a second lower surface, wherein the second upper and lower surfaces extend between the second proximal and distal ends and are spaced apart from each other and face opposite directions, wherein the first and second proximal ends are coupled to a base and are spaced apart from each other;
   a first piezoelectric layer disposed on the first lower surface and a second piezoelectric layer disposed on the second lower surface, the first piezoelectric layer is electrically coupled to first base electrodes and the second piezoelectric layer is electrically coupled to second base electrodes;

a distal tip coupled to the first and second distal ends, a distal end of the distal tip extending below a plane that includes the first and second lower surfaces;

further comprising a microcontroller coupled to the first and second base electrodes, the microcontroller configured to control motion of the tip by communicating electrical inputs to the first and second piezoelectric layers via the electrodes, wherein:

electrical inputs to the first and second piezoelectric layers that have the same amplitude and in-phase frequency cause the distal tip to vibrate vertically, electrical inputs that have the same amplitude and 180° out of phase frequency cause the distal tip to vibrate laterally, and electrical inputs that have a combination of a first input and a second input cause the distal tip to vibrate laterally and rotationally (3D vibration), wherein the first input has the same amplitude and in-phase frequency and the second input has the same amplitude and 180° out of phase frequency.

2. The dynamic sweep plow microcantilever device of claim 1, wherein the first and second elongated cantilevered arms extend parallel to each other.

3. The dynamic sweep plow microcantilver device of claim 1, wherein the first and second elongated cantilevered arms intersect at the distal ends thereof.

4. The dynamic sweep plow microcantilver device of claim 1, wherein the distal tip has a triangular prism shape, a pyramidal shape, a cone shape, or a spherical shape.

5. The dynamic sweep plow microcantilever device of claim 1, wherein the distal tip is formed by etching.

6. The dynamic sweep plow microcantilever device of claim 1, wherein the distal tip is separately formed and attached to the first and second distal ends.

7. The dynamic sweep plow microcantilever device of claim 1, further comprising a third piezoelectric layer disposed on the first upper surface and a fourth piezoelectric layer disposed on the second upper surface, wherein the third piezoelectric layer is electrically coupled to a third base electrode, and the fourth piezoelectric layer is electrically coupled to a fourth base electrode.

8. The dynamic sweep plow microcantilever device of claim 1, wherein the base is coupled to an atomic force microscope.

9. The dynamic sweep plow microcantilever device of claim 1, wherein the first and/or second elongated cantilevered arms are vibrated at a resonance frequency.

10. The dynamic sweep plow microcantilever device of claim 1, wherein the first and/or second elongated cantilevered arms are vibrated at any frequency.

11. The dynamic sweep plow microcantilever device of claim 10, wherein the first and/or second cantilevered arms are vibrated at an ultrasonic frequency.

12. The dynamic sweep plow microcantilever device of claim 1, wherein the first and second elongated cantilevered arms are vibrated at a frequency, and the device further comprises a microprocessor in electrical communication with the first and second base electrodes, the microprocessor being configured for increasing the vibration frequency to increase the vertical and/or torsional movement of the distal tip or decreasing the vibration frequency to decrease the vertical and/or torsional movement of the distal tip.

13. The dynamic sweep plow microcantilever device of claim 1, wherein the first and second piezoelectric layers are the same.

14. The dynamic sweep plow microcantilever device of claim 1, wherein the first and second piezoelectric layers are different.

* * * * *